US007706551B2

(12) United States Patent
Falcon

(10) Patent No.: US 7,706,551 B2
(45) Date of Patent: *Apr. 27, 2010

(54) DYNAMIC VOLUME CONTROL

(75) Inventor: Stephen Russell Falcon, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/278,273

(22) Filed: Mar. 31, 2006

(65) Prior Publication Data

US 2006/0177046 A1 Aug. 10, 2006

Related U.S. Application Data

(63) Continuation of application No. 10/304,152, filed on Nov. 26, 2002, now Pat. No. 7,142,678.

(51) Int. Cl.
*H03G 3/00* (2006.01)
*H03G 3/20* (2006.01)
*H04R 3/00* (2006.01)

(52) U.S. Cl. ....................... 381/104; 381/107; 381/109; 381/110

(58) Field of Classification Search ................... 700/94; 381/104, 107, 109, 119, 110
See application file for complete search history.

(56) References Cited

U.S. PATENT DOCUMENTS 4,374,300 A * 2/1983 Ponto et al. ................. 381/119
4,658,425 A * 4/1987 Julstrom ...................... 381/81
4,881,123 A * 11/1989 Chapple ..................... 381/104
5,289,546 A 2/1994 Hetherington
5,309,517 A 5/1994 Barclay
5,485,515 A * 1/1996 Allen et al. ................. 379/391
5,539,741 A 7/1996 Barraclough et al.
5,703,794 A 12/1997 Heddle et al.
2002/0039426 A1 4/2002 Takemoto et al.
2002/0072341 A1 6/2002 Ricard et al.
2003/0220705 A1* 11/2003 Ibey ............................ 700/94

OTHER PUBLICATIONS

Chrin et al., Performance of Soft Phories and Advances in Associated Technology; Bell Labs Technical Journal, 2002; vol. 7; No. 1; pp. 135-139.

Park et al., Integrated Echo and Noise Canceler for Hands-Free Applications, IEEE TRansactions on Circuits and Systems II: Analog and Digital Signal Processing; vol. 49; No. 3; pp. 188-195; Mar. 2002.

* cited by examiner

*Primary Examiner*—Vivian Chin
*Assistant Examiner*—Douglas J Suthers
(74) *Attorney, Agent, or Firm*—Lee & Hayes, PLLC

(57) ABSTRACT

In accordance with one aspect of the dynamic volume control, an indication that a user desires to input oral data to a system through one or more microphones of the system is received. In response to receipt of the indication, a volume level for audible signals output by one or more speakers of the system is automatically adjusted. In accordance with another aspect of the dynamic volume control, an indication that a communications source is about to output data through one or more speakers of a system is received. In response to receipt of the indication, a volume level for audible signals output by the one or more speakers is automatically adjusted based at least in part on a current volume setting. The volume level for the audible signals can be determined based on one or more of a variety of different parameters.

21 Claims, 5 Drawing Sheets

DYNAMIC VOLUME CONTROL

RELATED APPLICATIONS

This application is a continuation of U.S. patent application Ser. No. 10/304,152, filed Nov. 26, 2002, which is hereby incorporated by reference herein.

TECHNICAL FIELD

This invention relates to audio systems and volume controls, and particularly to dynamic volume control.

BACKGROUND

Computer technology is continually advancing, resulting in computers which become more powerful, less expensive, and/or smaller than their predecessors. As a result, computers are becomingly increasingly commonplace in many different environments, such as homes, offices, businesses, vehicles, educational facilities, and so forth.

However, problems can be encountered in integrating computers into different environments. For example, it can be difficult to hear feedback from the computer in some situations because the playback volume level is too low or the feedback is being masked (e.g., by music being played back). A similar problem is that some components (e.g., a speech recognizer or cellular phone) can experience difficulty in hearing the user because the sound level from other sources (e.g., music being played back) is too high. These problems can frustrate users and decrease the user-friendliness of such computers.

The dynamic volume control described herein helps at least partially solve these problems.

SUMMARY

Dynamic volume control is described herein.

In accordance with one aspect, an indication that a user desires to input oral data to a system through one or more microphones of the system is received. In response to receipt of the indication, a volume level for audible signals output by one or more speakers of the system is automatically adjusted.

In accordance with another aspect, an indication that a communications source is about to output data through one or more speakers of a system is received. In response to receipt of the indication, a volume level for audible signals output by the one or more speakers is automatically adjusted based at least in part on a current volume setting.

In accordance with another aspect, dynamic volume control is implemented based at least in part on the following parameters: a minimum user interface sound level parameter, a minimum user interface sound level over noise parameter, a minimum user interface sound over program sound amount parameter, a maximum user interface sound level parameter, a minimum user voice over program sound amount parameter, whether a user is expected to speak, voice isolation characteristics of a microphone in the system, acoustic echo cancellation characteristics of the system, a voice level-relaxed parameter, a voice level-forced parameter, and a volume level manually set by the user.

BRIEF DESCRIPTION OF THE DRAWINGS

The same numbers are used throughout the document to reference like components and/or features.

DETAILED DESCRIPTION

Dynamic volume control is described herein. The dynamic volume control automatically adjusts the volume level in a system as appropriate to allow the system to hear what the user is saying and/or to allow the user to hear what the system is trying to communicate to the user. In certain embodiments, various parameters are user-configurable, allowing the user to customize the system to his or her desires.

Figure 1:
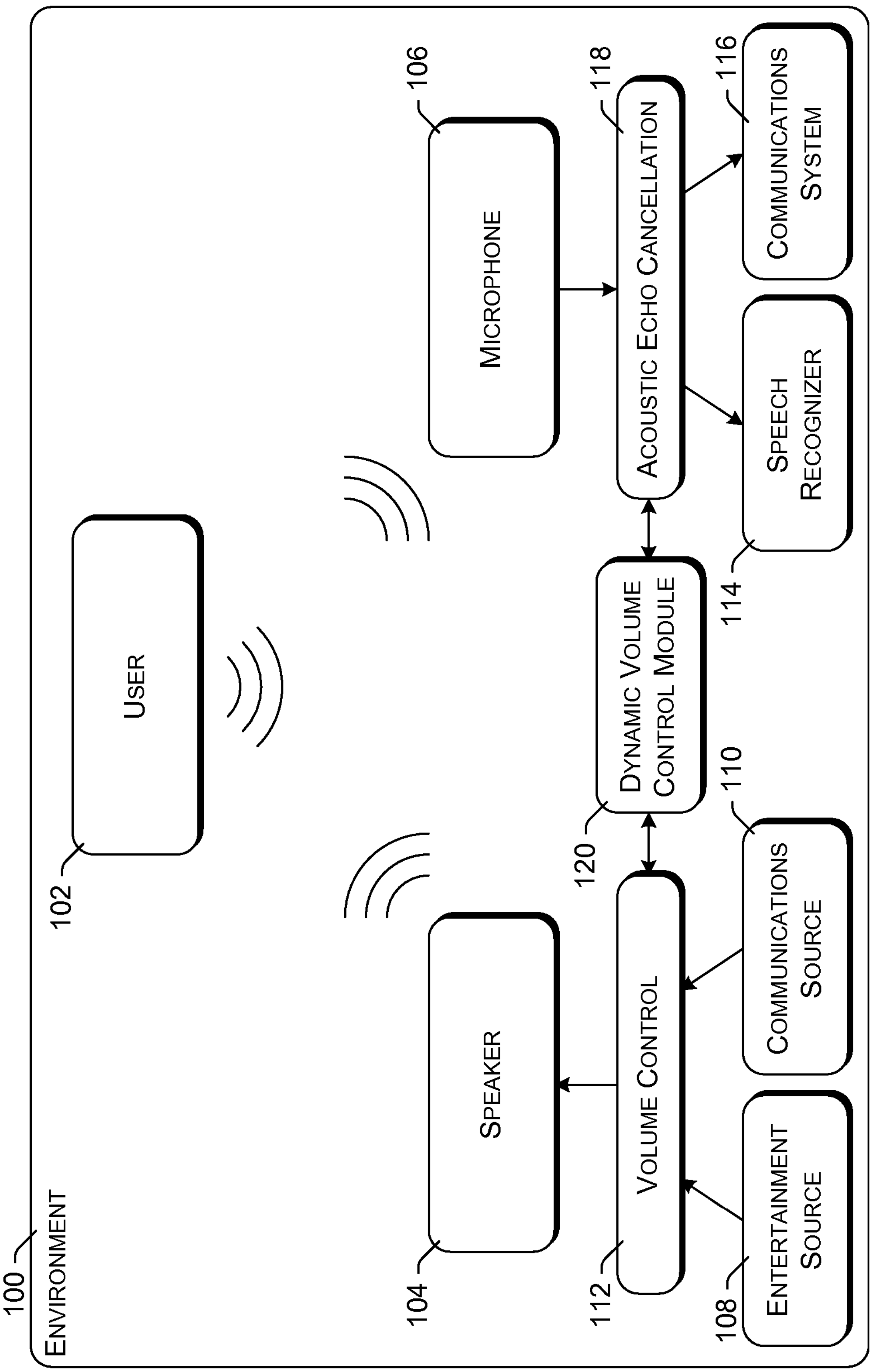
FIG. 1 is a block diagram illustrating an exemplary environment in which the dynamic volume control can be used.

FIG. 1 is a block diagram illustrating an exemplary environment 100 in which the dynamic volume control can be used. Environment 100 may be, for example, a home setting, an office or business setting, an educational facility setting, a vehicle (e.g., car, truck, recreational vehicle (RV), bus, train, plane, boat, etc.) setting, and so forth. Within environment 100 is a user 102, a speaker 104, and a microphone 106. Although only one user 102, one speaker 104, and one microphone 106 are illustrated in FIG. 1, it is to be appreciated that environment 100 may include one or more users 102, one or more speakers 104, and one or more microphones 106.

Environment 100 also includes an entertainment source 108 and a communications source 110. Entertainment source 108 represents one or more sources of program audio data, such as: an AM/FM tuner; a satellite radio tuner; a compact disc (CD) player; an analog or digital tape player; a digital versatile disk (DVD) player; an MPEG Audio Layer 3 (MP3) player; a Windows Media Audio (WMA) player; a streaming media player; and so forth. Such audio data from entertainment source 108 is also referred to as a program sound.

Communications source 110 represents one or more sources of user interface (UI) audio data, such as: a cellular telephone (or other wireless communications device); notification or feedback signals from a computer (e.g., a warning beep, an indication that electronic mail has been received, an indication of a navigation to occur (e.g., turn right at the next intersection), etc.); a text to speech (TTS) system (e.g., to generate audio data that is the "reading" of an electronic mail message); and so forth. Such audio data from communications source 110 is also referred to as a UI sound.

Entertainment source 108 and communications source 110 both input signals to volume control 112. These signals represent audio data, and can be in any of a variety of analog and/or digital formats. Volume control 112 attenuates the input signals appropriately based on the volume level setting. User 102 can manually change the volume level setting (e.g., using a volume control knob and/or buttons), and dynamic volume control module 120 can automatically change the volume setting, as discussed in more detail below. Volume control 112 can attenuate signals from entertainment source 108 and communications source 110 by different amounts, or alternatively by the same amount. The attenuated input signals are then communicated to speaker 104, which generates audible sound that is output into environment 100. This audible sound can be detected (e.g., heard) by both user 102 and microphone 106 if the volume level is high enough. Audio signals from entertainment source 108 and communications source 110 are combined (e.g., by volume control 112), so that audio from both sources can be played concurrently by user 102. Alternatively, audio signals from only one of entertainment source 108 and communications source 110 may be played by speaker 104 at a time.

Environment 100 also includes a speech recognizer 114 and a communications system 116. Speech recognizer 114 represents a speech recognition module(s) capable of receiving audio input and recognizing the audio input. The recognized audio input can be used in a variety of manners, such as to generate text (e.g., for dictation), to perform commands (e.g., allowing a user to input voice commands to a computer system in a vehicle), and so forth. Communications system 116 represents a destination for audio input, such as a cellular telephone (or other wireless communications device). Communications system 116 may be the same as (or alternatively may include or may be included in) communications source 110.

Speech recognizer 114 and communications system 116 both receive audio data from microphone 106. Microphone 106 receives audio signals from user 102 and speaker 104, as well as any other audio sources in environment 100 (e.g., road noise, wind noise, dogs barking, people laughing, etc.). The sound received at microphone 106 is converted into an audio signal in any of a variety of conventional manners. The resulting audio signal can be in any of a variety of analog and/or digital formats. The conversion may be performed by microphone 106 or alternatively another component (not shown) in environment 100. Microphone 106 optionally includes voice isolation functionality that allows oral data from user 102 to be identified more easily, as discussed in more detail below. Optionally, the audio data (or audio signals) may be passed through acoustic echo cancellation module 118 prior to being input to speech recognizer 114 and/or communications system 116, as discussed in more detail below.

In certain embodiments, one or more of entertainment source 108, communications source 110, volume control 112, acoustic echo cancellation module 118, speech recognizer 114, communications system 116, and dynamic volume control module 120 are implemented in a vehicle stereo system or automotive PC. Additionally, one or more of these components may be separate, such as a cellular telephone (operating as communications source 110 and communications system 116) being separate from the vehicle stereo system that includes dynamic volume control module 120. In alternate embodiments, one or more of entertainment source 108, communications source 110, volume control 112, acoustic echo cancellation module 118, speech recognizer 114, communications system 116, and dynamic volume control module 120 are implemented in other devices, such as a home entertainment system, a home or business computer, a gaming console, and so forth.

During operation, dynamic volume control module 120 automatically determines whether to attenuate the volume level by way of volume control 112, and if the volume level is to be attenuated then dynamic volume control module 120 also determines the amount of the attenuation. Dynamic volume control module 120 attenuates the volume level appropriately to assist speech recognizer 114 and/or communications system 116 in differentiating the voice of user 102 over the other audio data (e.g., from speaker 104) in environment 100. Dynamic volume control module 120 also attenuates the volume level appropriately to assist the user in hearing audio signals from communications source 110 over the other audio data (e.g., from entertainment source 108 through speaker 104) in environment 100. This can include, for example, attenuating the volume of audio data received from entertainment source 108 but not from communications source 110. The manner in which dynamic volume control module 120 determines whether to attenuate the volume level, and if so the amount of the attenuation, is discussed in more detail below.

Figure 2:
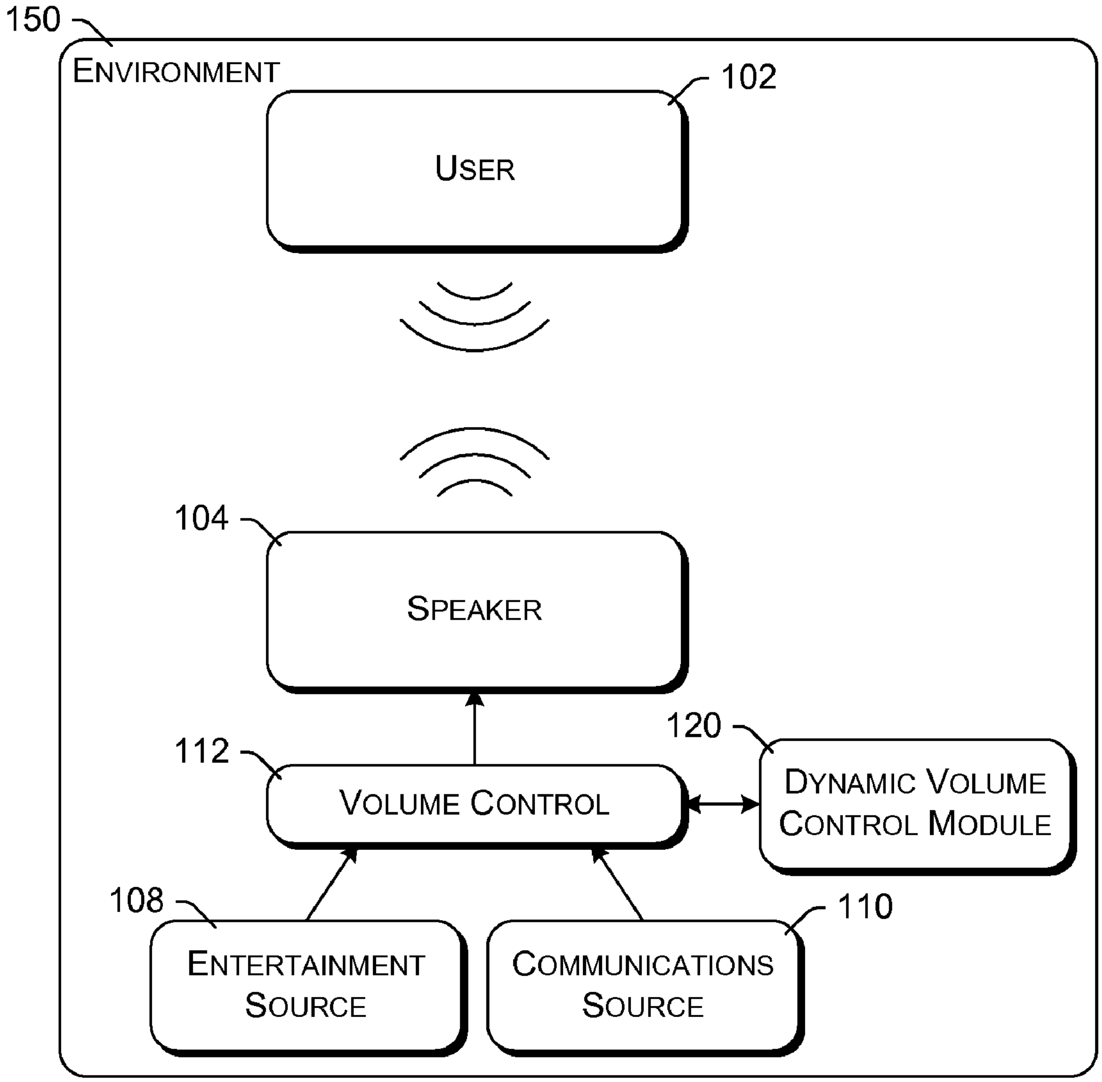
FIG. 2 is a block diagram illustrating another exemplary environment in which the dynamic volume control can be used.

FIG. 2 is a block diagram illustrating another exemplary environment 150 in which the dynamic volume control can be used. Analogous to environment 100 of FIG. 1, environment 150 may be, for example, a home setting, an office or business setting, an educational facility setting, a vehicle setting, and so forth. Environment 150, analogous to environment 100 of FIG. 1, includes a user 102, a speaker 104, an entertainment source 108, a communications source 110, a volume control 112, and a dynamic volume control module 120.

Environment 150 differs from environment 100 in that no microphone 106, speech recognizer 114, communications system 116, or acoustic echo cancellation module 118 is included in environment 150. User 102 in environment 150 thus can hear data from entertainment source 108 and communications source 110, but does not provide oral data input to any of the components in environment 150.

Figure 3:
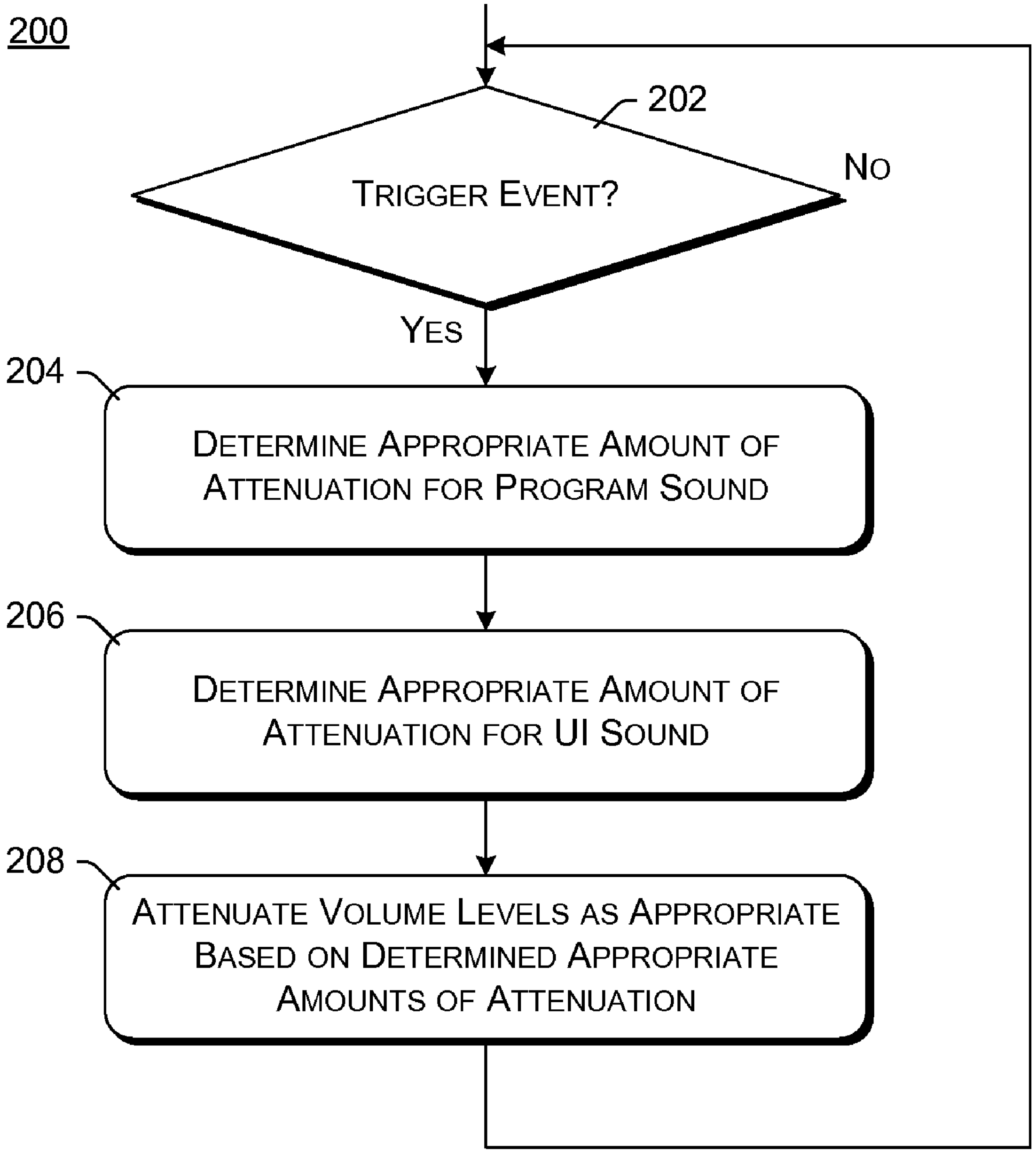
FIG. 3 is a flowchart illustrating an exemplary process for dynamically controlling volume level.

FIG. 3 is a flowchart illustrating an exemplary process 200 for dynamically controlling volume level. Process 200 is implemented by dynamic volume control module 120 of FIG. 1 or FIG. 2. Process 200 may be implemented in software, firmware, hardware, or combinations thereof.

Initially a determination is made as to whether a trigger event has occurred (act 202). Dynamic volume control module 120 automatically determines whether to adjust the volume level (by way of volume control 112) whenever a trigger event occurs. A trigger event refers to a change in the environment that may result in the adjustment of the volume level by dynamic volume control module 120. Examples of trigger events include: speech recognizer 114 being activated (e.g., situations where user 102 is ready to speak and the user's voice is to be input to speech recognizer 114) or deactivated (e.g., situations where user 102 is no longer ready to speak and the user's voice is not to be input to speech recognizer 114); communications source 110 and/or communications system 116 being activated (e.g., situations where information from communications source 110 is to be provided to user 102 or the user is ready to speak and the user's voice is to be input to communications system 116) or deactivated (e.g., situations where no information from communications source 110 is to be provided to user 102 or the user is no longer ready to speak and the user's voice is not to be input to communications system 116); and user volume control changes (e.g., the user requests that the volume level be increased or decreased).

Trigger events can be detected in different manners. In one implementation, a "talk" button is presented to user 102 (e.g., a button on the user's car stereo or automotive PC) to activate speech recognizer 114. Selection of the "talk" button informs speech recognizer 114 and dynamic volume control module 120 that the user is about to input oral data to microphone 106 for recognition. When user 102 presses the "talk" button, an indication of the selection is forwarded to speech dynamic volume control module 120 to attenuate the volume level as appropriate, and optionally to speech recognizer 114 to begin processing received input data to recognize what user 102 is saying. This "talk" button may also be a toggle button, so that pressing the button again deactivates speech recognizer 114. A similar "talk" button may also be implemented to activate and/or deactivate communications system 116.

Trigger events can also be detected automatically by various components. For example, the user 102 pressing the "talk" or "send" button of his or her cell phone can be interpreted as activating communications system 116. Similarly, the user pressing the "hang up" or "end" button on his or her cell phone can be interpreted as deactivating communications system 116. By way of another example, when communications source 110 is ready to communicate information to user 102, source 110 can activate itself and, when communications source 110 does not currently have information to be communicated to user 102, source 110 can deactivate itself. By way of yet another example, when communications system 116 receives data (e.g., via a cellular telephone communication channel to another cellular telephone (or other telephone)), system 116 can activate itself, (if not already activated), and similarly when communications system 116 receives an indication that it is not going to be receiving data (e.g., the cellular telephone communication channel has been severed due to the other cellular telephone hanging up), system 116 can deactivate itself.

When a trigger event occurs, dynamic volume control module 120 determines, based on various parameters discussed below, an appropriate amount of attenuation for program sound (act 204), and an appropriate amount of attenuation for UI sound (act 206). Dynamic volume control module 120 then adjusts or attenuates the current volume level (or volume level setting) for the program sound and the UI sound as appropriate so that the determined appropriate amounts of attenuation are achieved (act 208). It should be noted that situations can arise where the appropriate amount of attenuation of the volume level for program sound and/or UI sound is none or zero. Attenuating the volume level of audio data from entertainment source 108 allows audio data from communications source 110 to be heard by user 102 and/or oral data from user 102 to be input to speech recognizer 114 or communications system 116.

The volume level remains at the level determined in act 204 until another trigger event occurs (act 202). When another trigger event occurs, the new appropriate amounts of attenuation are determined (acts 204 and 206) and the volume levels are attenuated appropriately based on these newly determined amounts of attenuation (act 208). It should be noted that the new trigger event may result in additional attenuation of the volume level, no attenuation of the volume level, or a reduced attenuation of the volume level (including the possibility of returning the volume level to its setting when the initial trigger event occurred).

It should be noted that in some implementations acts 204 and 206 may be optional. For example, if there is no program sound being generated then act 204 need not be performed. By way of another example, if there is no UI sound being generated then act 206 need not be performed.

It should also be noted that multiple trigger events may overlap in process 200. For example, communications source 110 of FIG. 1 may sound an audible alert to user 102 that he or she has received a piece of electronic mail, which is a trigger event, while the user is talking on a cellular phone (e.g., communications system 116), which is also a trigger event. In this example, after the audible alert has been sounded, communications source 110 is deactivated so the volume level no longer needs to be attenuated because of the audible alert, but the volume level is still attenuated because of the cellular phone conversation.

Dynamic volume control module 120 makes the determination of the appropriate amount of attenuation in act 204 based on various parameters. Table I lists several parameters, one or more of which can be used in making the determination of the appropriate amount of attenuation. These parameters are discussed in more detail in the paragraphs that follow.

TABLE I

| Parameter |
|---|
| Minimum UI sound level (dB SPL) |
| Minimum UI sound level over noise (dB) |
| Minimum UI sound over program sound (dB) |
| Maximum UI sound level (dB SPL) |
| Minimum user voice over program sound (dB) |
| UI sound playing |
| SR (Speech Recognizer) listening |
| Voice level—relaxed (dB SPL) |
| Voice level—forced (dB SPL) |
| Maximum amplifier SPL (dB SPL) |
| Voice isolation attenuation of noise and program sound (dB) |
| Acoustic echo cancellation (AEC) attenuation (dB) |
| Volume control setting |
| Volume control range |

The parameters illustrated in Table I can have various settings. In one implementation, dynamic volume control module 120 includes default values that can be overridden by the user—such parameter values are user-configurable, allowing the user to change the values to suit his or her desires. In the discussions that follow, default values and typical values for various parameters are listed. It is to be appreciated that these values are exemplary only, and that the dynamic volume control discussed herein can use different values.

The minimum UI sound level (dB SPL) parameter represents (using decibel Sound Pressure Level (dB SPL)) a minimum sound level for audio data from communications source 110, irrespective of noise. This parameter sets a floor sound level below which sound levels for audio data from communications source 110 will not drop. In one implementation, the default value for the minimum UI sound level parameter is 50 dB SPL, and typical values for the parameter vary from 40 dB SPL to 60 dB SPL. The minimum UI sound level parameter may also be a changing value based on changes in the environment (e.g., in order to compensate for noise in the vehicle environment, the minimum UI sound level may be automatically increased as the vehicle speed increases and may be automatically decreased as the vehicle speed decreases).

The minimum UI sound level over noise (dB) parameter represents the minimum level above the noise floor that audio data from communications source 110 can be allowed to play. This parameter is a difference threshold that is to be enforced between the minimum UI sound level and the noise in the environment. In one implementation, the default value for the minimum UI sound level over noise parameter is 9 dB, and typical values for the parameter vary from 4 dB to 15 dB. By enforcing this difference threshold, dynamic value control module 120 can ensure that communications source 110 can be heard over noise in the environment.

The minimum UI sound over program sound (dB) parameter represents the minimum level above that of entertainment audio that audio data from communications source 110 can be allowed to play. This parameter is a difference threshold that is to be enforced between the minimum UI sound level for audio data from communications source 110 and the program sound level for audio data from entertainment source 108. In one implementation, the default value for the minimum UI sound over program sound parameter is 9 dB, and typical values for the parameter vary from 4 dB to 15 dB. By enforcing this difference threshold, dynamic value control module 120 can ensure that communications source 110 can be heard over the program sound.

The maximum UI sound level (dB SPL) parameter represents a maximum sound level that audio data from communications source 110 will be allowed to play, according to maximum user tolerance. This parameter sets a ceiling sound level above which sound levels for audio data from communications source 110 will not rise. In one implementation, the default value for the maximum UI sound level parameter is 80 dB SPL, and typical values for the parameter vary from 70 dB SPL to 85 dB SPL.

The minimum user voice over program sound (dB) parameter represents the lowest speaking level expected to be heard from the user. This parameter is a difference threshold that is to be enforced between the user voice level and the program sound level for audio data from entertainment source 108. In one implementation, the default value for the minimum user voice over program sound parameter is 30 dB, and typical values for the parameter vary from 20 dB to 40 dB.

The UI sound playing parameter is a flag value indicating whether a UI sound is being played from communications source 110, such as TTS or a sound effect. This flag is set when dynamic volume control module 120 receives an indication that communications source 110 is ready to communicate information to user 102.

The SR (speech recognizer) listening parameter is a flag value indicating whether the user is expected to speak. This flag is set (e.g., to a value indicating "yes') when dynamic volume control module 120 receives an indication that speech recognizer 114 and/or communications system 116 is activated.

The voice level-relaxed (dB SPL) parameter represents the voice level for the user when he or she is not trying to overcome ambient noise and program sound. In one implementation, the default value for the voice level-relaxed parameter is 55 dB SPL, and typical values for the parameter vary from 50 dB SPL to 60 dB SPL.

The voice level-forced (dB SPL) parameter represents the maximum voice level for the user when he or she is trying to overcome the ambient noise and program sound. In one implementation, the default value for the voice level-forced parameter is 65 dB SPL, and typical values for the parameter vary from 60 dB SPL to 70 dB SPL.

The maximum amplifier SPL (dB SPL) parameter represents how loud an unattenuated signal will be given the power of the audio amplifier, speaker(s), and acoustic environment. In one implementation, the default value for the maximum amplifier SPL parameter is 95 dB SPL, and typical values for the parameter vary from 80 dB SPL to 110 dB SPL.

The voice isolation attenuation of noise and program sound (negative dB) parameter represents how well the user's voice can be isolated by the microphone (or alternatively other components) from other sounds in the environment. Voice isolation techniques can be used to "pick out" the user's voice within a noisy environment, providing an effectively increased voice to noise ratio. These voice isolation techniques can be implemented by the microphone itself and/or one or more other components in the environment that are external to the microphone. Examples of such voice isolation techniques include beamforming, directional acoustic design, various processing algorithms, and so forth For example, Cardioid or Hypercardioid microphones may be used. Different microphones can use different voice isolation techniques (and possibly multiple voice isolation techniques), and can have different amounts of voice isolation attenuation. In one implementation, the default value for the voice isolation attenuation of noise and program sound parameter is −20 dB, and typical values for the parameter vary from 0 dB to −40 dB.

The acoustic echo cancellation (AEC) attenuation (negative dB) parameter represents how well acoustic echo cancellation techniques can be used to remove sound being output by entertainment source 108 and/or communications source 110. Acoustic echo cancellation can be used to remove the program audio picked up by the microphone, effectively increasing the voice to program ratio. The audio signals generated by entertainment source 108 and communications source 110 can be input to acoustic echo cancellation module 118 of FIG. 1, allowing any of a variety of acoustic echo cancellation techniques to be used to remove those audio signals from the sound received at microphone 106. Different acoustic echo cancellation techniques can have different amounts of attenuation. In one implementation, the default value for the acoustic echo cancellation attenuation parameter is −20 dB, and typical values for the parameter vary from 0 dB to −40 dB.

The volume control setting parameter represents the volume level that is manually set by the user. The volume level may also be a default volume level (e.g., set by a manufacturer or set for each time the system is powered-on). The volume control setting can have virtually any number of levels as desired by the system designer. In one implementation, typical values for the volume control setting parameter range from 1 to 100.

The volume control range parameter represents the range of volume settings that can be manually set by the user. For example, if the volume control knob has 32 different settings that the user can manually set, then the volume control range parameter is 32. The volume control range can have virtually any number of settings as desired by the system designer. In one implementation, typical values for the volume control range parameter are between 1 to 100.

Figure 4:
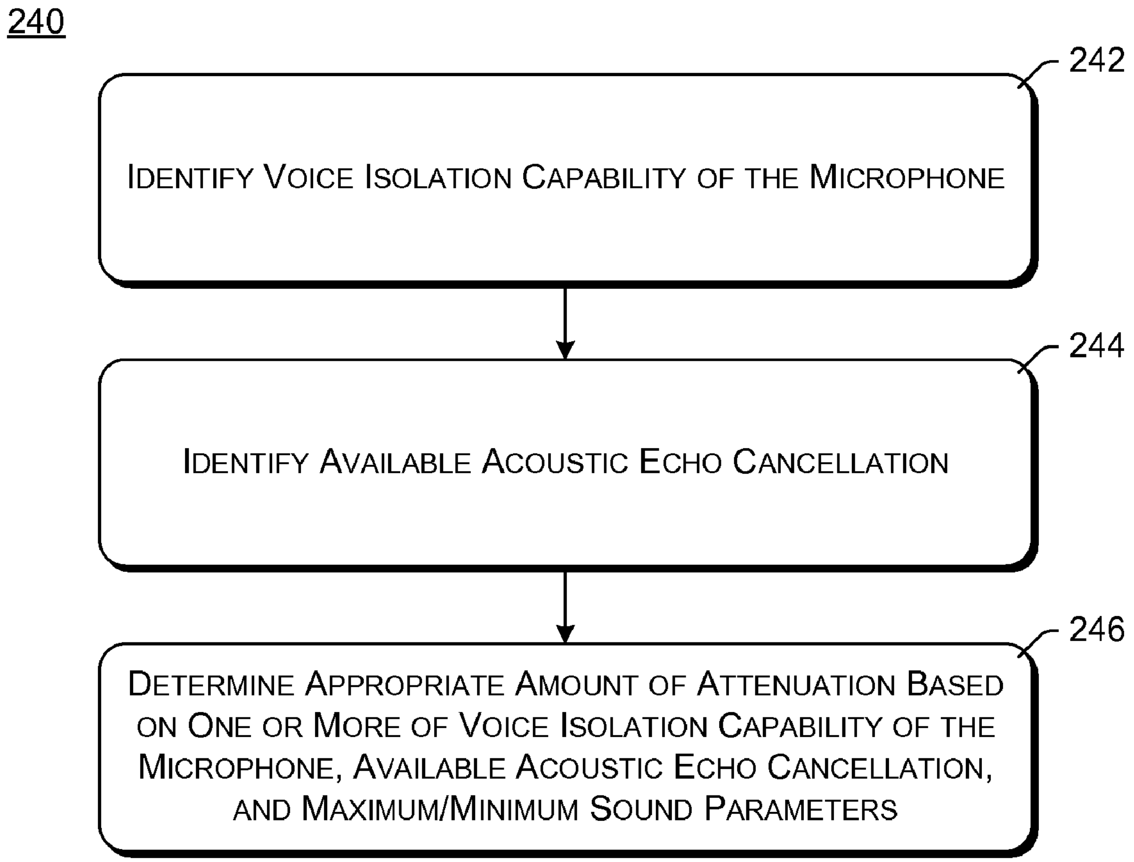
FIG. 4 is a flowchart illustrating an exemplary process for determining an appropriate amount of attenuation when the user is inputting oral data.

FIG. 4 is a flowchart illustrating an exemplary process 240 for determining an appropriate amount of attenuation when the user is inputting oral data. Process 240 is implemented by dynamic volume control module 120 of FIG. 1 or FIG. 2. Process 200 may be implemented in software, firmware, hardware, or combinations thereof.

Initially, the voice isolation capability of the microphone is identified (act 242) and the available acoustic echo cancellation is identified (act 244). An appropriate amount of attenuation based on one or more of the voice isolation capability of the microphone, the available acoustic echo cancellation, and the maximum and minimum sound parameters discussed above is then determined (act 246). As discussed above, the minimum user voice over program sound parameter is a difference threshold that is to be enforced between the user voice level and the program sound level for audio data from entertainment source 108. This difference threshold can be obtained, at least in part, by the use of voice isolation and acoustic echo cancellation techniques. These techniques are thus accounted for in determining the amount that dynamic volume control module 120 should attenuate the volume.

Dynamic volume control module 120 performs one or more of a set of calculations to determine the appropriate amount(s) of attenuation. These calculations are discussed in the following paragraphs. In the following discussions reference is made to a MIN and a MAX function in pseudo code. MIN represents a "minimum" function using the syntax MIN (x, y), and returns which of the values x and y is smaller. Similarly, MAX represents a "maximum" function using the syntax MAX (x, y), and returns which of the values x and y is larger.

One calculation performed by dynamic volume control module 120 is to determine a program attenuation value (ProgAtten) to enforce the minimum voice over program sound (represented in dB) parameter according to the following pseudo code:

```
If SR listening=yes,

Then ProgAtten=MIN(0, Volume Control Setting/
    Volume control range*(Voice level-forced−Voice
    level-relaxed)+Voice level-relaxed)−((Maximum
    amplifier SPL+(−(Volume control range−Volume
    Control Setting)*2))+Voice isolation attenuation
    of noise and program sound+acoustic echo can-
    cellation attenuation)−minimum user voice over
    program sound);

Else ProgAtten=0;                                          (1)
```

In calculation (1), SR listening refers to the SR listening parameter discussed above, Volume Control Setting refers to the volume control setting parameter discussed above, Volume control range refers to the volume control range parameter discussed above, the asterisk (*) refers to the multiply function, Voice level-forced refers to the voice level-forced parameter discussed above, Voice level-relaxed refers to the voice level-relaxed parameter discussed above, Maximum amplifier SPL refers to the maximum amplifier SPL parameter discussed above, Voice isolation attenuation of noise and program sound represents the Voice isolation attenuation of noise and program sound parameter discussed above, acoustic echo cancellation attenuation represents the acoustic echo cancellation attenuation parameter discussed above, and minimum user voice over program sound represents the minimum user voice over program sound parameter discussed above.

If the user is not expected to speak (so the speech recognizer 114 is not listening), then the ProgAtten value is set to zero in calculation (1).

The dynamic volume control module 120 also determines a ProgAtten2 value which represents the program attenuation to enforce the minimum UI sound over program sound as follows:

```
If UI Sound Playing=yes,

Then ProgAtten2=MIN((MIN(MAX(MIN((((Maxi-
    mum amplifier SPL+(−(Volume control range−
    Volume Control Setting)*2))+ProgAtten)+Mini-
    mum UI sound over program sound), (Maximum
    amplifier SPL+(−(Volume control range−Volume
    Control Setting)*2))), Minimum UI sound level),
    Maximum UI sound level))−(((Maximum ampli-
    fier SPL+(−(Volume control range−Volume Con-
    trol Setting)*2))+ProgAtten)+Minimum UI
    sound over program sound),0)

Else ProgAtten2=0                                          (2)
```

In calculation (2), UI Sound Playing represents the UI sound playing parameter discussed above, Maximum amplifier SPL represents the Maximum amplifier SPL parameter discussed above, Volume control range refers to the volume control range parameter discussed above, Volume Control Setting refers to the volume control setting parameter discussed above, the asterisk (*) refers to the multiply function, ProgAtten represents the ProgAtten value from calculation (1) above, Minimum UI sound over program sound represents the Minimum UI sound over program sound parameter discussed above, Minimum UI sound level represents the Minimum UI sound level parameter discussed above, Maximum UI sound level represents the Maximum UI sound level parameter discussed above, If no UI sound is being played, then the ProgAtten2 value is set to zero in calculation (2).

In calculations (1) and (2) above, certain constants (such as the value 2) are included. It is to be appreciated that these constants are examples only and can be larger or smaller in different implementations.

The dynamic volume control module 120 also determines a TotalAtten value which represents the amount to attenuate the program sound (in addition to the volume setting's attenuation) as follows:

```
TotalAtten=ProgAtten+ProgAtten2                            (3)
```

In calculation (3), ProgAtten represents the ProgAtten value from calculation (1) above, and ProgAtten2 represents the ProgAtten2 value from calculation (2) above.

The TotalAtten value from calculation (3) represents the amount (in negative dB) that the program sound from entertainment source 108 is to be attenuated (in addition to the volume setting's attenuation) in order to ensure that volume constraints have been met. The result of calculation (3) will be zero (indicating no attenuation) or a negative number (the negative sign indicating reducing rather than increasing the sound level). Using the calculations and parameters discussed above, attenuating the program sound by the TotalAtten value will allow UI sound from communications source 110 to be heard over any program sound from entertainment source 108, and/or allow oral data from user 102 to be identified by speech recognizer 114 and/or communications system 116.

Another calculation performed by dynamic volume control module 120 is to determine a UI sound attenuation value (UISndAtten) which represents an amount of attenuation for the UI sound level (in negative dB SPL) to ensure that the UI sound level does not exceed a maximum level from the standpoint of user comfort. The UISndAtten value is determined according to the following pseudo code:

```
If UI Sound Playing=yes,

Then UISndAtten=MIN(MAX(MIN((Maximum
    amplifier SPL+−(Volume control range−Volume
    Control Setting)*2+ProgAtten+Minimum UI
    sound over program sound), Maximum amplifier
    SPL+−(Volume control range−Volume Control
    Setting)*2), Minimum UI sound level), Maxi-
    mum UI sound level)−Maximum amplifier SPL              (4)
```

In calculation (4), Maximum amplifier SPL refers to the maximum amplifier SPL parameter discussed above, Volume control range refers to the volume control range parameter discussed above, Volume Control Setting refers to the volume control setting parameter discussed above, the asterisk (*) refers to the multiply function, ProgAtten represents the ProgAtten value from calculation (1) above, Minimum UI sound over program sound represents the Minimum UI sound over program sound parameter discussed above, Minimum UI sound level represents the Minimum UI sound level parameter discussed above, and Maximum UI sound level represents the Maximum UI sound level parameter discussed above.

It should be noted that in some implementations not all of the calculations above need be performed. For example, if there is no UI sound being played then calculation (4) need not be performed. By way of another example, if there is no program sound being played then calculations (2) and (3) need not be performed.

It should be noted that in some embodiments some of the calculations (1) through (3) discussed above may not be used. For example, in environment 150 of FIG. 2 where there is no microphone, then calculation (1) need not be calculated and the value ProgAtten need not be included in calculation (3).

In addition to the attenuation of program sound, various actions may be taken to ensure that speech recognizer 114 and/or communications system 116 can identify oral data from user 102 over any UI sounds from communications source 110. In one implementation, the voice isolation techniques utilized by microphone 106 and/or the acoustic echo cancellation techniques utilized by module 118 can be relied on to ensure that speech recognizer 114 and/or communications system 116 can identify oral data from user 102 over any UI sounds from communications source 110. In another implementation, UI sounds from communications system 116 are disabled when speech recognizer 114 and/or communications system 116 is activated, or alternatively speech recognizer 114 and/or communications system 116 could be disabled when communications system 116 is activated.

Figure 5:
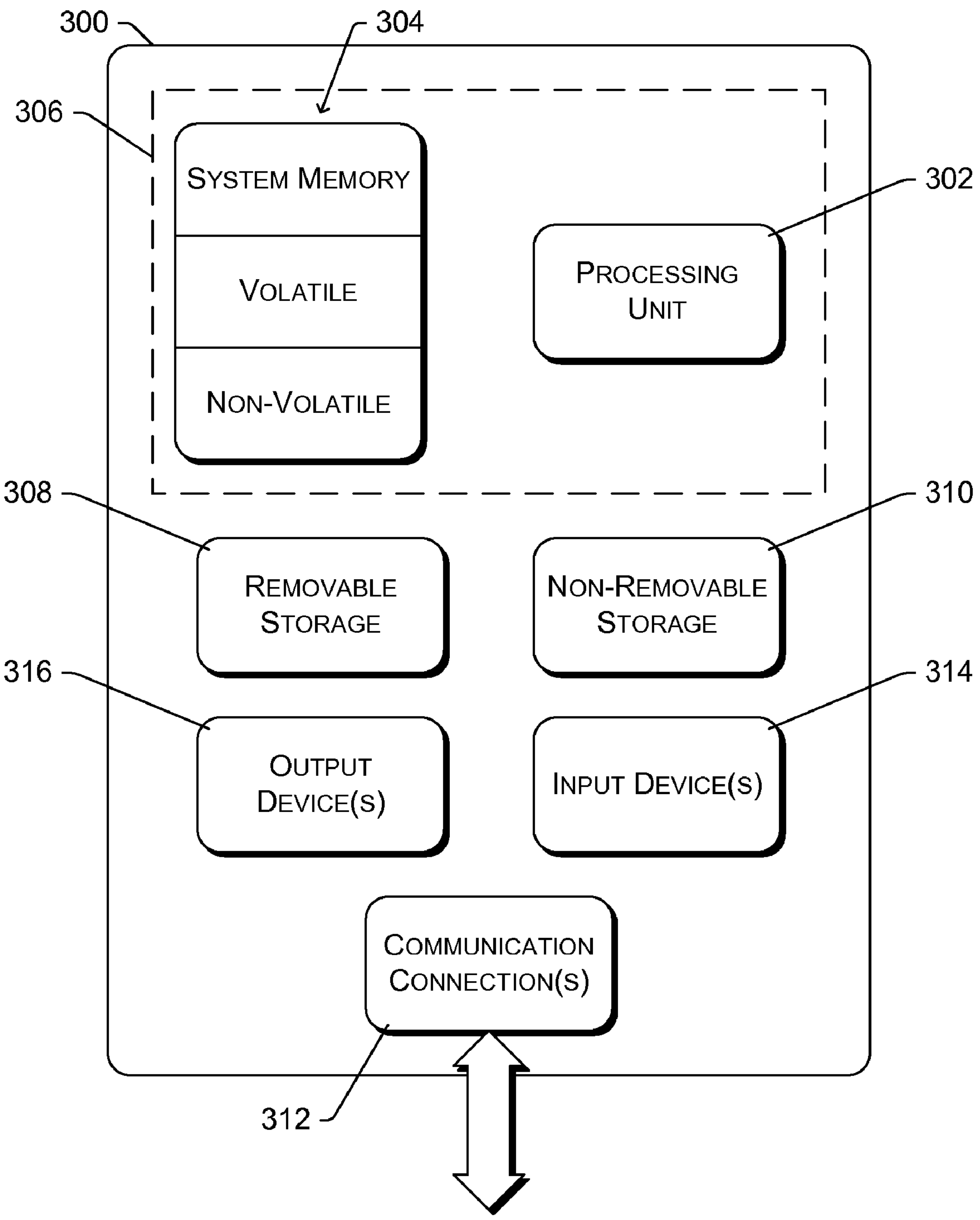
FIG. 5 illustrates an exemplary general computing device in which the dynamic volume control can be used.

FIG. 5 illustrates an exemplary general computing device 300. Computing device 300 can be, for example, a device implementing dynamic volume control module 120 of FIG. 1 or FIG. 2. In a basic configuration, computing device 300 typically includes at least one processing unit 302 and memory 304. Depending on the exact configuration and type of computing device, memory 304 may be volatile (such as RAM), non-volatile (such as ROM, flash memory, etc.) or some combination of the two. This basic configuration is illustrated in FIG. 5 by dashed line 306. Additionally, device 300 may also have additional features/functionality. For example, device 300 may also include additional storage (removable and/or non-removable), such as magnetic or optical disks or tape. Such additional storage is illustrated in FIG. 5 by removable storage 308 and non-removable storage 310. Device 300 may also include one or more additional processing units, such as a co-processor, a security processor (e.g., to perform security operations, such as encryption and/or decryption operations), and so forth.

Device 300 may also contain communications connection (s) 312 that allow the device to communicate with other devices. Device 300 may also have input device(s) 314 such as keyboard, mouse, pen, voice input device, touch input device, and so forth. Output device(s) 316 such as a display, speakers, printer, etc. may also be included.

Various modules and techniques may be described herein in the general context of computer-executable instructions, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

An implementation of these modules and techniques may be stored on or transmitted across some form of computer readable media. Computer readable media can be any available media that can be accessed by a computer. By way of example, and not limitation, computer readable media may comprise "computer storage media" and "communications media."

"Computer storage media" includes volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

CONCLUSION

Although the description above uses language that is specific to structural features and/or methodological acts, it is to be understood that the invention defined in the appended claims is not limited to the specific features or acts described. Rather, the specific features and acts are disclosed as exemplary forms of implementing the invention.

The invention claimed is:

1. A method comprising:

receiving, in a system including one or more speakers and a microphone, an indication that a user desires to input oral data to the system through the microphone;

determining, in response to the received indication and based at least in part on a plurality of parameters, an amount to attenuate a volume level for audible signals output by the one or more speakers, the determining comprising:

identifying voice isolation capability of the microphone, the voice isolation capability describing how well the microphone is capable of isolating a user's voice from other sound in an environment without assistance from one or more external components;

identifying available acoustic echo cancellation of the system; and calculating the amount to attenuate a volume level of program sound in the system based on the identified voice isolation capability and available acoustic echo cancellation, and further based on one or more of the following parameters:

a minimum user interface sound level over noise parameter value that represents a minimum level above the minimum sound level for audio data from a communications source that the audio data from the communications source is allowed to play;

a minimum user interface sound over program sound amount parameter value that represents a minimum level above a sound level for audio data from an entertainment source that audio data from the communications source is allowed to play;

a voice level-relaxed parameter value representing a voice level for a user when the user it not trying to overcome ambient noise and program sound; and a voice level-forced parameter value representing a maximum voice level for a user when the user is trying to overcome ambient noise and program sound; and automatically adjusting, in response to receiving the indication, the volume level by the determined amount.

2. The method as recited in claim 1, wherein the amount to attenuate the volume level is based at least in part on a current volume control setting which is the volume level at the time the indication is received.

3. The method as recited in claim 1, wherein determining the amount to attenuate the volume level further comprises:

determining an amount to attenuate a volume level of UI sound in the system.

4. The method as recited in claim 1, further comprising:

receiving an indication that the user has finished the input of oral data to the system; and returning, in response to the indication that the user has finished the input of oral data to the system, the volume level to a previous volume level when the indication that the user desires to input oral data was received.

5. The method as recited in claim 1, further comprising:

detecting, after automatically adjusting the volume level, that a trigger event has occurred;

determining a new amount to attenuate the volume based on the trigger event; and automatically adjusting, in response to detecting that the trigger event has occurred, the volume level for audible signals output by the one or more speakers by the determine new amount.

6. A system comprising:

a microphone;

an acoustic echo cancellation component connected to the microphone, the acoustic echo cancellation component being configured to identify:

voice isolation capability of the microphone, the voice isolation capability describing how well a user's voice is isolated by the microphone from other sound in an environment without assistance from one or more external components; and available acoustic echo cancellation parameter of the system;

one or more speakers; and a dynamic volume control component connected to the one or more speaker and the acoustic echo cancellation component, the dynamic volume control component being configured to perform actions comprising:

determining an amount to attenuate a volume level for audible signals output by the one or more speakers based at least in part on current volume setting, the identified voice isolation capability and available acoustic echo cancellation, and further based on one or more of the following parameters:

a minimum user interface sound level over noise parameter value that represents a minimum level above the minimum sound level for audio data from a communications source that the audio data from the communications source is allowed to play;

a minimum user interface sound over program sound amount parameter value that represents a minimum level above a sound level for audio data from an entertainment source that audio data from the communications source is allowed to play;

a voice level-relaxed parameter value representing a voice level for a user when the user it not trying to overcome ambient noise and program sound; and a voice level-forced parameter value representing a maximum voice level for a user when the user is trying to overcome ambient noise and program sound; and automatically attenuating volume level of the one or more speakers by the determined amount.

7. The system as recited in claim 6, wherein the determining the amount to attenuate a volume level for audible signals output by the one or more speakers is further based on one or more of the following parameters:

a minimum user interface sound level parameter value that represents a minimum sound level for audio data from the communications source;

a maximum user interface sound level parameter value that represents a maximum sound level that audio data from the communications source is allowed to play;

a minimum user voice over program sound amount parameter value that represents the lowest speaking level expected to be heard from the user;

an indication of whether a user is expected to speak; and a volume level manually set by the user.

8. The system as recited in claim 6, wherein the determining comprises determining an amount to attenuate a volume level of audio data received from an entertainment source in the system.

9. The system as recited in claim 7, wherein the determining comprises determining an amount to attenuate a volume level of audio data received from the communications source.

10. The system as recited in claim 6, further comprising:

a receiving means for receiving an indication that the communications source is about to output or the communications source has finished outputting data through the one or more speakers, wherein the dynamic volume control component is configured to perform actions further comprising:

determining again, in response to receiving the indication, a new amount to adjust the volume level for audible signals output by the one or more speakers based on the current volume setting and the plurality of parameters; and automatically adjusting the volume level for audible signals output by the one or more speakers by the new amount.

11. The system as recited in claim 6, wherein the actions further comprise:

detecting, after automatically adjusting the volume level, that a trigger event has occurred; and automatically adjusting, in response to detecting that the trigger event has occurred, the volume level for audible signals output by the one or more speakers.

12. A method implemented in a system, the method comprising:

receiving audio data to be output by one or more speakers; and changing a volume level of audible signals to be output by the one or more speakers based on a plurality of parameters comprising:

a minimum user interface sound level parameter value that represents a minimum sound level for audio data from a communications source;

a minimum user interface sound level over noise parameter value that represents a minimum level above the minimum sound level for audio data from the communications source that the audio data from the communications source is allowed to play;

a minimum user interface sound over program sound amount parameter value that represents a minimum level above a sound level for audio data from an entertainment source that audio data from the communications source is allowed to play;

a maximum user interface sound level parameter value that represents a maximum sound level that audio data from the communications source is allowed to play;

a minimum user voice over program sound amount parameter value that represents the lowest speaking level expected to be heard from the user;

an indication of whether a user is expected to speak;

voice isolation characteristics of a microphone in the system;

acoustic echo cancellation characteristics of the system;

a voice level-relaxed parameter value that represents a voice level for a user when the user it not trying to overcome ambient noise and program sound;

a voice level-forced parameter value that represents a maximum voice level for a user when the user is trying to overcome ambient noise and program sound; and a volume level manually set by the user, wherein the changing is based on all of the plurality of parameters.

13. A method as recited in claim 12, wherein one or more of the parameters is user-configurable.

14. A method as recited in claim 12, further comprising:

receiving, an indication that the user desires to input oral data to the system through the microphone; and wherein the changing the volume level comprises automatically adjusting, in response to receiving the indication, the volume level for the audible signals to be output by the one or more speakers.

15. A method as recited in claim 12, further comprising:

receiving an indication that the communications source is about to output data through the one or more speakers; and wherein the changing the volume level comprises automatically adjusting, in response to receiving the indication, the volume level for the audible signals to be output by the one or more speakers.

16. A method as recited in claim 1, further comprising:

receiving, in the system, an indication that the communications source is ready to output a user interface sound;

determining, in response to the received indication that the communications source is ready to output a user interface sound, a second amount to attenuate the volume level for audible signals output by the one or more speakers;

summing the amount and the second amount; and wherein the automatically adjusting comprises automatically adjusting, in response to both indications, the volume level by the sum of the amount and the second amount.

17. A method as recited in claim 1, the plurality of parameters including a minimum user voice over program sound parameter that represents a lowest speaking level that is expected to be heard from the user.

18. A method as recited in claim 1, the plurality of parameters including a voice level-forced parameter that represents a maximum voice level for the user when the user is trying to overcome ambient noise and program sound, and a voice level-relaxed parameter that represents a voice level for the user when the user is not trying to overcome the ambient noise and program sound.

19. The system as recited in claim 6, wherein the plurality of parameters further comprises a minimum UI sound over program sound parameter that represents a minimum level above that of entertainment audio that audio data from the communications source can be allowed to play, and a minimum UI sound level parameter that represents a minimum sound level for audio data from the communications source.

20. One or more computer storage media having stored thereon instructions that, when executed at a system having a processing unit, configure the system to implement the method as recited in claim 1.

21. One or more computer storage media having stored thereon instructions that, when executed at a system having a processing unit, configure the system to implement the method as recited in claim 12.

* * * * *

UNITED STATES PATENT AND TRADEMARK OFFICE

CERTIFICATE OF CORRECTION

PATENT NO. : 7,706,551 B2
APPLICATION NO. : 11/278273
DATED : April 27, 2010
INVENTOR(S) : Stephen Russell Falcon It is certified that error appears in the above-identified patent and that said Letters Patent is hereby corrected as shown below:

In column 14, line 16, in Claim 9, delete “claim 7,” and insert -- claim 6, --, therefor.

Signed and Sealed this
Fifteenth Day of February, 2011

David J. Kappos
*Director of the United States Patent and Trademark Office*